(12) United States Patent
Lutchyn et al.

(10) Patent No.: US 11,877,523 B2
(45) Date of Patent: Jan. 16, 2024

(54) USE OF SELECTIVE HYDROGEN ETCHING TECHNIQUE FOR BUILDING TOPOLOGICAL QUBITS

(71) Applicant: Microsoft Technology Licensing, LLC, Redmond, WA (US)

(72) Inventors: Roman Lutchyn, Santa Barbara, CA (US); Michael Freedman, Santa Barbara, CA (US); Andrey Antipov, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 82 days.

(21) Appl. No.: 17/369,732

(22) Filed: Jul. 7, 2021

(65) Prior Publication Data
US 2021/0336119 A1 Oct. 28, 2021

Related U.S. Application Data

(62) Division of application No. 16/024,552, filed on Jun. 29, 2018, now Pat. No. 11,081,634.
(Continued)

(51) Int. Cl.
*H01L 29/20* (2006.01)
*H10N 60/84* (2023.01)
(Continued)

(52) U.S. Cl.
CPC .............. *H10N 60/84* (2023.02); *B82Y 10/00* (2013.01); *G06N 10/00* (2019.01); *H01L 29/0673* (2013.01); *H01L 29/66977* (2013.01); *H03K 3/38* (2013.01); *H10N 60/01* (2023.02); *H10N 60/128* (2023.02); *H10N 60/30* (2023.02); *H10N 60/85* (2023.02); *H01L 29/20* (2013.01)

(58) Field of Classification Search
CPC ................. H01L 39/10; H01L 29/0673; H01L 29/66977; H01L 39/12; H01L 39/16; H01L 39/228; H01L 29/24; H01L 29/20; G06N 10/00; B82Y 10/00
See application file for complete search history.

(56) References Cited

U.S. PATENT DOCUMENTS

| | | | |
|---|---|---|---|
| 2012/0112168 A1* | 5/2012 | Bonderson | G06N 10/00 257/31 |
| 2019/0341459 A1* | 11/2019 | Pillarisetty | B82Y 40/00 |

\* cited by examiner

*Primary Examiner* — Mounir S Amer
*Assistant Examiner* — Alexander Belousov
(74) *Attorney, Agent, or Firm* — Klarquist Sparkman, LLP

(57) ABSTRACT

Embodiments of a Majorana-based qubit are disclosed herein. The qubit is based on the formation of superconducting islands, some parts of which are topological (T) and some parts of which are non-topological. Also disclosed are example techniques for fabricating such qubits. In one embodiment, a semiconductor nanowire is grown, the semiconductor nanowire having a surface with an oxide layer. A dielectric insulator layer is deposited onto a portion of the oxide layer of the semiconductor nanowire, the portion being designed to operate as a non-topological segment in the quantum device. An etching process is performed on the oxide layer of the semiconductor nanowire that removes the oxide layer at the surface of the semiconductor nanowire but maintains the oxide layer in the portion having the deposited dielectric insulator layer. A superconductive layer is deposited on the surface of the semiconductor nanowire, including over the dielectric insulator layer.

14 Claims, 12 Drawing Sheets
(10 of 12 Drawing Sheet(s) Filed in Color)

Related U.S. Application Data

(60) Provisional application No. 62/530,098, filed on Jul. 7, 2017.

(51) Int. Cl.
| | | |
|---|---|---|
| *H03K 3/38* | (2006.01) |
| *G06N 10/00* | (2022.01) |
| *B82Y 10/00* | (2011.01) |
| *H01L 29/66* | (2006.01) |
| *H01L 29/06* | (2006.01) |
| *H10N 60/01* | (2023.01) |
| *H10N 60/30* | (2023.01) |
| *H10N 60/85* | (2023.01) |
| *H10N 60/10* | (2023.01) |

1700 generate a topologically protected qubit having Majorana zero modes by applying an external electric field to segments of a quantum device - 1710

FIG. 17

USE OF SELECTIVE HYDROGEN ETCHING TECHNIQUE FOR BUILDING TOPOLOGICAL QUBITS

CROSS-REFERENCE TO RELATED APPLICATIONS

This application is a divisional of U.S. patent application Ser. No. 16/024,552, filed Jun. 29, 2018, which claims the benefit of U.S. Provisional Application No. 62/530,098 entitled "USE OF SELECTIVE HYDROGEN ETCHING TECHNIQUE FOR BUILDING TOPOLOGICAL QUBITS" and filed on Jul. 7, 2017, both of which are hereby incorporated herein by reference.

FIELD

This application concerns quantum computing devices. In particular, this application concerns topologically protected quantum devices.

SUMMARY

Example embodiments of a Majorana-based qubit (sometimes referred to as a "box" qubit) are disclosed herein. In particular embodiment, the qubit is based on the formation of superconducting islands, some parts of which are topological and some parts of which are non-topological. Also disclosed are example techniques for fabricating such qubits.

In one example embodiment, a semiconductor nanowire is grown, the semiconductor nanowire having a surface with an oxide layer. In some embodiments, the semiconductor nanowire is an indium antimony (InSb) or an indium arsenide (InAs) nanowire. A dielectric insulator layer is deposited onto a portion of the oxide layer of the semiconductor nanowire, the portion being designed to operate as a non-topological segment in the quantum device. An etching process is performed on the oxide layer of the semiconductor nanowire that removes the oxide layer at the surface of the semiconductor nanowire but maintains the oxide layer in the portion having the deposited dielectric insulator layer. The etching process can be a hydrogen or other atomic plasma etching process. A superconductive layer is deposited on the surface of the semiconductor nanowire, including over the dielectric insulator layer. The superconductive layer can be an aluminum layer. One or more electric gates (further referred to as "gates") are applied. For instance, the surface can be deemed a first surface, and the method can further comprise applying one or more gates to a second surface of the semiconductor nanowire.

Also disclosed is an example procedure for operating a quantum device in accordance with embodiments of the disclosed technology. For example, in some embodiments, a topologically protected qubit having Majorana zero modes is generated by applying an external electric field to segments of the quantum device.

Further embodiments include a quantum device, comprising a semiconductive nanowire having a surface that has been etched to remove an oxide layer at a first portion and a second portion of the surface, the semiconductive nanowire further having an oxide layer at a third portion of the surface, the third portion being between the first portion and the second portion of the surface; and a dielectric insulator layer deposited over the third portion but not over the first portion and the second portion. In certain implementations, the first portion and the second portion are operable to produce topologically protected segments for Majorana zero modes when an in-plane magnetic field is applied. In some implementations, the third portion is operable to provide a non-topologically protected segment when the in-plane magnetic field is applied. In certain implementations, the quantum device further comprises a superconductive layer deposited over the first portion, the second portion, and the third portion. In certain implementations, the superconductive layer can be formed from aluminum.

Other embodiments include a quantum device, comprising a first semiconductive wire having a first wire surface that has been etched to remove a native oxide layer; a second semiconductive wire having a second wire surface that has been etched to remove the native oxide layer; and a semiconductive bridge interposed between the first semiconductive wire and the semiconductive wire, the semiconductive bridge having a native oxide layer that is protected from etching by a dielectric insulator layer deposited over the semiconductive bridge. In some implementations, the first semiconductive wire is operable to generate a first pair of Majorana zero modes when an in-plane magnetic field is applied, and wherein the second semiconductive wire is operable to generate a second pair of Majorana zero modes when the in-plane magnetic field is applied. In further implementations, the quantum device comprises a superconductive layer deposited over the first semiconductive wire, the second semiconductive wire, and the semiconductive bridge. In some implementations, the superconductive layer is formed from aluminum. In certain implementations, the quantum device is part of a quad qubit device or part of a hexon qubit device.

The foregoing and other objects, features, and advantages of the disclosed technology will become more apparent from the following detailed description, which proceeds with reference to the accompanying figures.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 17 is a flowchart showing an example procedure for operating a quantum device in accordance with embodiments of the disclosed technology.

DETAILED DESCRIPTION

I. General Considerations

Figure 1:
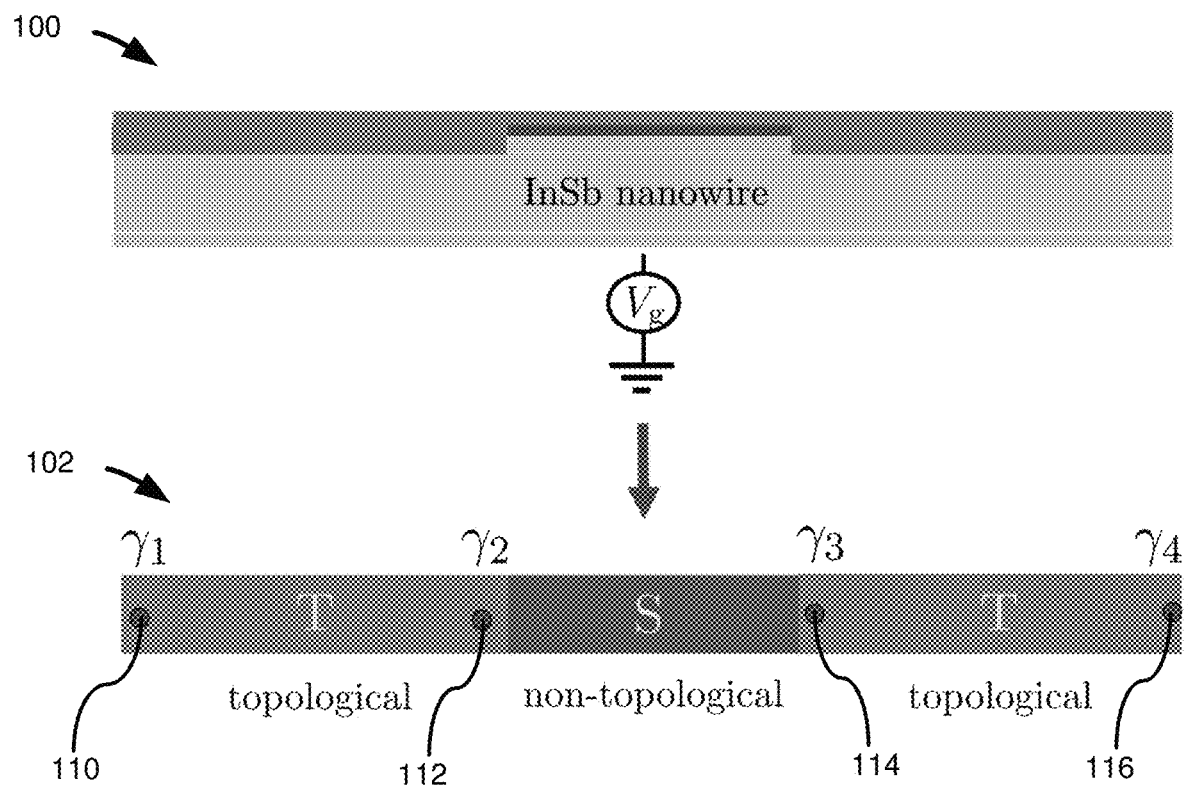
FIG. 1 is a set of schematic block diagrams showing an example Majorana box qubit structure in accordance with embodiments of the disclosed technology.

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Various alternatives to the examples described herein are possible. The various aspects of the disclosed technology can be used in combination or separately. Different embodiments use one or more of the described innovations. Some of the innovations described herein address one or more of the problems noted in the background. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Detailed Embodiments of the Disclosed Technology

Example embodiments of a Majorana-based qubit (sometimes referred to as a "box" qubit) are disclosed herein. Embodiments of the box qubits are based on the formation of superconducting islands, some parts of which are topological (labelled "T") and some parts of which are non-topological (e.g., conventional S-wave, and labelled "S"). In certain embodiments, Majorana zero modes appear in pairs at the ends of the segments (e.g., linear segments) of the T portion where it abuts the S portion. Mesoscopic islands supporting Majorana qubits should be carefully fabricated to avoid the formation of quasiparticle traps. It is remarkably challenging to build single islands containing strongly-coupled S and T segments without creating quasiparticle traps. It has been proposed that this can be accomplished, at least in the case of nanowire qubits, by building a translationally-invariant structure and then gating it appropriately to create a desired combination of S and T segments. However, band structure analysis casts some doubt on the efficacy of this approach; electrostatic screening by the superconductor results in a very weak lever arm (e.g. a volt at the gate results in an effective change of the Fermi energy of a few millivolts near the superconductor and thus the lever arm is $1/1000$). In embodiments of the disclosed technology, a dielectric insulator is used to prevent electron exchange between the semiconductor and superconductor.

In the context of building Majorana box qubits in accordance with the disclosed technology, the problem of a weak lever arm can arise in at least three scenarios: (1) nanowires grown using Vapor-Liquid-Solid mechanism (see Gazibegovic et al. "Epitaxy of Advanced Nanowire Quantum Devices," arxiv:1705:01480 (2017)); (2) a two-dimensional semiconductors grown using MBE in which desired nanowire network is defined by the electrostatic gates (see Suominen et al., "Scalable Majorana Devices," arXiv:1703.03699 (2017)); and (3) using selected area growth approach (SAG) (see Gazibegovic et al. "Epitaxy of Advanced Nanowire Quantum Devices," arxiv:1705:01480 (2017)). The disclosed technology is applicable to all three, though the embodiments described in FIGS. 1-8 will focus on the nanowire. It should be understood that this focus is for example purposes, as the technology can be adapted for other scenarios as well. Further, for the embodiments shown in FIGS. 1-8, one can regard them as cross-sectional pictures in which the region to be protected by the dielectric cap may vary as one moves in the y-direction (e.g., perpendicular to the nanowire direction).

FIG. 1 is a set of schematic block diagrams showing an example Majorana box qubit structure in accordance with embodiments of the disclosed technology. In particular, schematic block diagram 100 is a side view of an example Majorana box qubit and schematic block diagram 102 is a top view of the structure. In FIG. 1, four Majorana zero modes (110, 112, 114, 116) are illustrated at the ends of the segments (or islands) of the T portion where it abuts the S portion. The four Majorana zero modes are also designated as $\gamma_1$, $\gamma_2$, $\gamma_3$, and $\gamma_4$. The details of the interior components of the Majorana qubits are described in detail in the discussion below.

FIGS. 2-6 is a series of schematic block diagrams 200-600 illustrating a method for fabricating an example Majorana box qubit. The particular operations and sequence of operations should not be construed as limiting, as they can be performed alone or in any combination, subcombination, and/or sequence with one another. Additionally, the illustrated operations can be performed together with one or more other operations.

Figure 2:
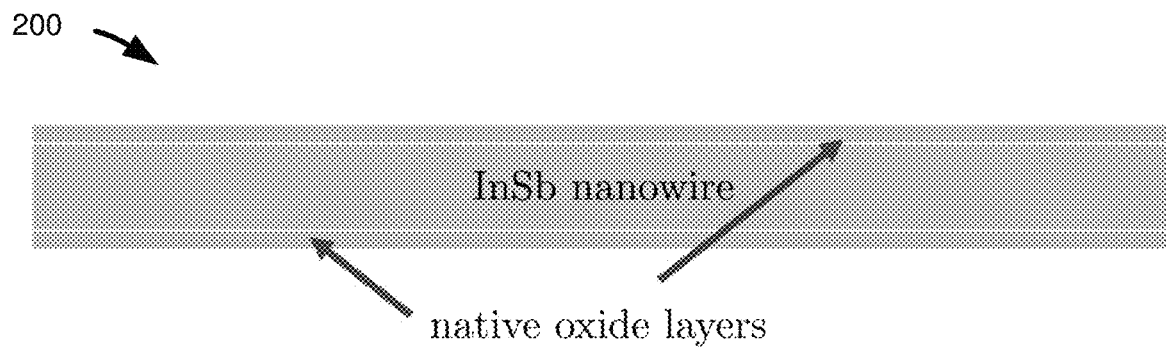
FIGS. 2-6 is a series of schematic block diagrams illustrating a method for fabricating an example Majorana box qubit.
Figure 3:
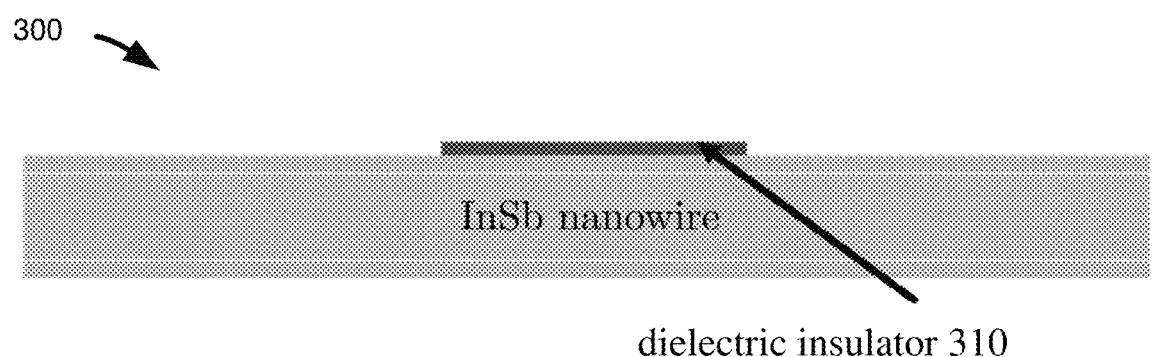

FIG. 2 is a schematic block diagram 200 showing a fabrication act for fabricating an example Majorana box qubit. In FIG. 2, a nanowire is grown having top and bottom native oxide layers (as illustrated). It should be understood, however, that FIGS. 2-6 show cross-sectional side views of the nanowire. Thus, the full three-dimensional wire (which may take a number of forms, including a hexagonal form) has the oxide layers over the entire surface of the nanowire. The nanowire can be grown using a variety of techniques, but in one embodiment is grown using a vapor-liquid-solid growth mechanism. Further, the nanowire can be a variety of semiconductive composites. In the illustrated embodiment (and for purposes of the illustration through the application), the nanowire is an indium antimonide Sb) nanowire. Other embodiments can use a different semiconductor, such as indium arsenide (InAs). FIG. 3 is a schematic block diagram 300 showing a further fabrication act. In FIG. 3, a dielectric insulator is deposited. In certain embodiments, the dielectric insulator is resistant to hydrogen cleaning on a semiconductor nanowire. In some embodiments, the dielectric insulator is a Silicon Dioxide ($SiO_2$) layer or a Hafnium Dioxide ($HfO_2$). An example approach for depositing this layer is described at Webb et al., Nano Lett. 15, 8, 4865-4875 (2015).

Figure 4:

FIG. 4 is a schematic block diagram 400 showing a further fabrication act. In FIG. 4, portions of the native oxide are removed from the nanowire. In the illustrated embodiment, after the deposition, nanowires are transferred ex-situ to a molecular beam epitaxy chamber where atomic hydrogen cleaning is done to remove the native oxide from the nanowire (e.g., the InSb surface, InAs surface, or other suitable semiconductive surface).

Figure 5:
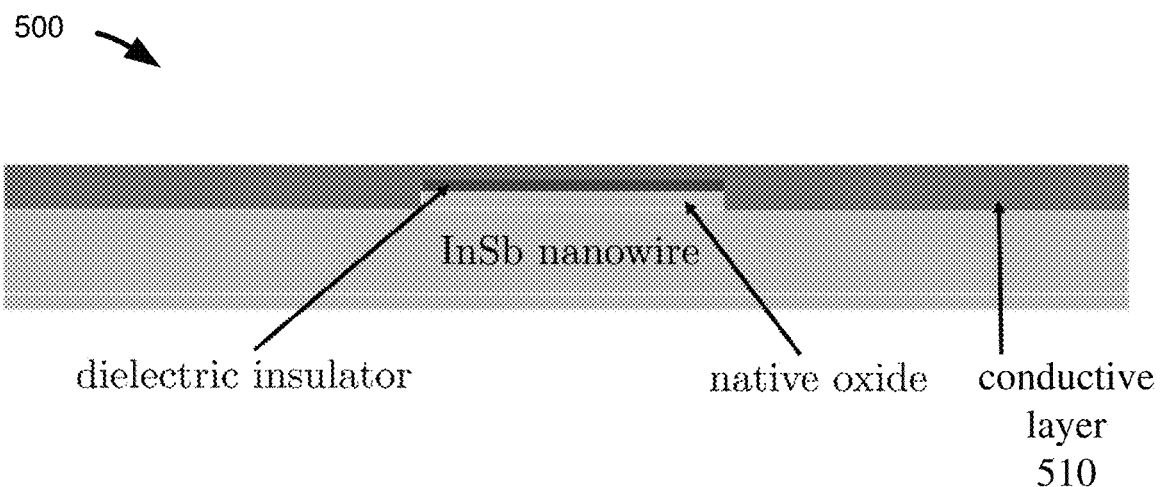

FIG. 5 is a schematic block diagram 500 showing a further fabrication act. In FIG. 5, a superconductive layer 510 is deposited on the Majorana box structure. In particular implementations, the superconductive layer 510 is an aluminum layer that is deposited on the Majorana box structure.

Figure 6:
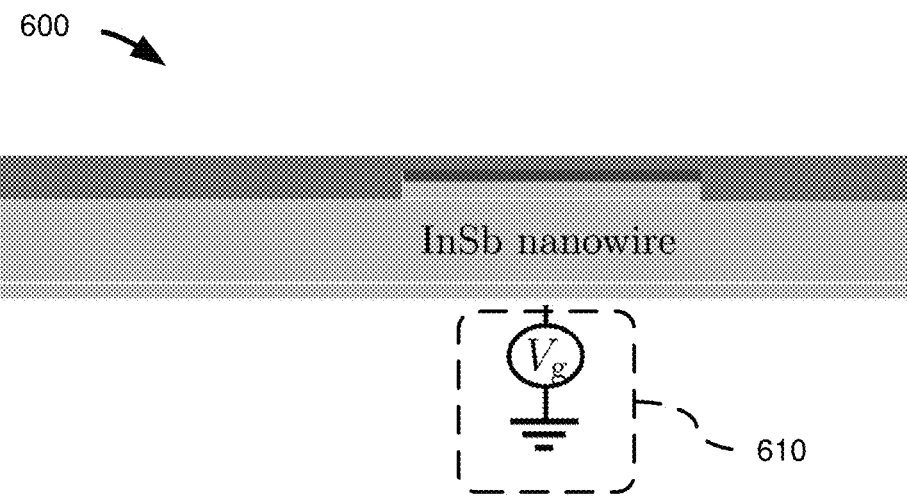

FIG. 6 is a schematic block diagram 600 showing a further fabrication act. In FIG. 6, a series of gates (shown as a single gate, but representing a set of gates as shown below in FIG. 8) is applied to the device. The gate(s) can have a variety of orientations. In the illustrated embodiments of FIG. 6 and FIG. 8, the gate(s) are shown as backgates, but any one or more of the gates could also be side gates or connected at other orientations along the nanowire. In the illustrated embodiment (with the example aluminum layer), the region having good contact with aluminum electric field due to applied gate voltage will be strongly screened by electrons from aluminum (the level arm is small) By contrast, in the middle region, where the dielectric insulator prevents exchange of electrons between aluminum and the semiconductor, the screening effects will be weak. Thus, the semiconductor can be depleted in this region.

Figure 7:
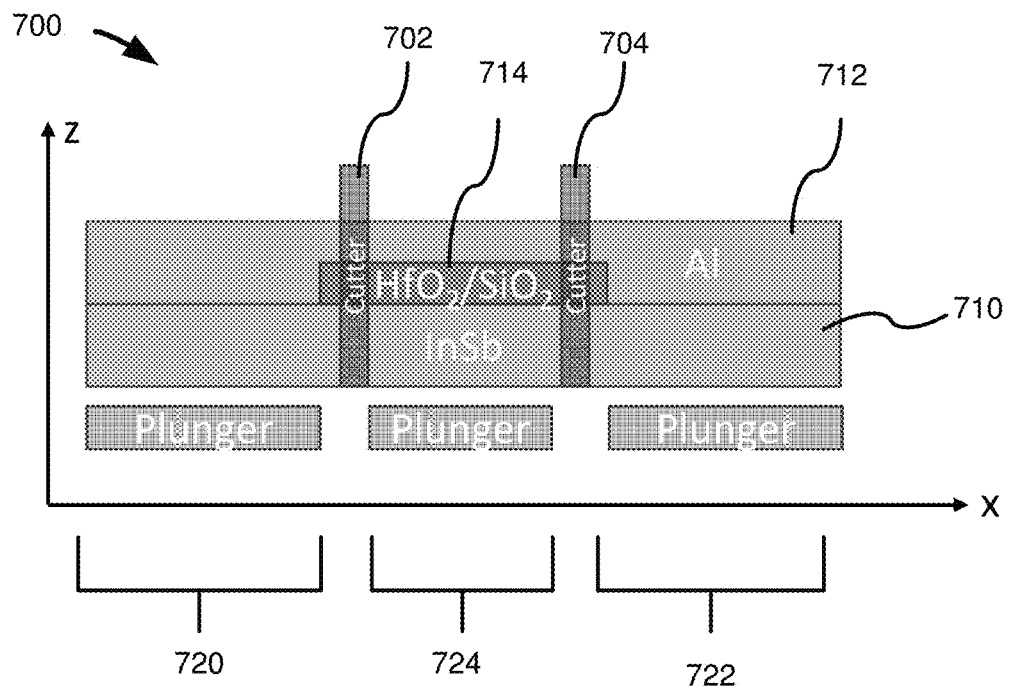
FIG. 7 is a schematic block diagram of a side view of another example device in accordance with the disclosed technology.

FIG. 7 is a schematic block diagram 700 of a side view of another example device in accordance with the disclosed technology. In the illustrated embodiment, an indium antimonide (InSb) layer 710 is overlayed by an aluminum (Al) layer 712 as described above in FIGS. 2-6. FIG. 7 also shows two "cutter" or "wrapper" electrodes 702, 704 that are oriented perpendicularly to the underlying substrate and located near (but not entirely at) the ends of the intermediate dielectric insulator layer 714 (shown as a $HfO_2$ and/or $SiO_2$ layer by way of example).

Although the dimensions can vary from implementation to implementation, in certain embodiments, the wrapper gates are 50-100 nm away from the edge of the dielectric. Further, in particular embodiments, the width of the wrapper gates is at least 100 nm. Additionally, in particular embodiments, the width of the dielectric is 0.5-1 μm, and the distance between the Majorana zero modes on each respective island is 1-10 μm. Further, the cutter electrodes are connected to gates (e.g., via a capacitor) that apply an adjustable voltage to the electrodes such that the superconducting layer (provided by the Al layer 712) can be selectively connected or disconnected front the topological segments (or islands), shown at 720, 722

Further, the portions marked "plunger" are representative of underlying electrodes that are also connected to voltage source that apply an adjustable voltage to the topological islands 720, 722 as well as the non-topological island 724.

Figure 8:
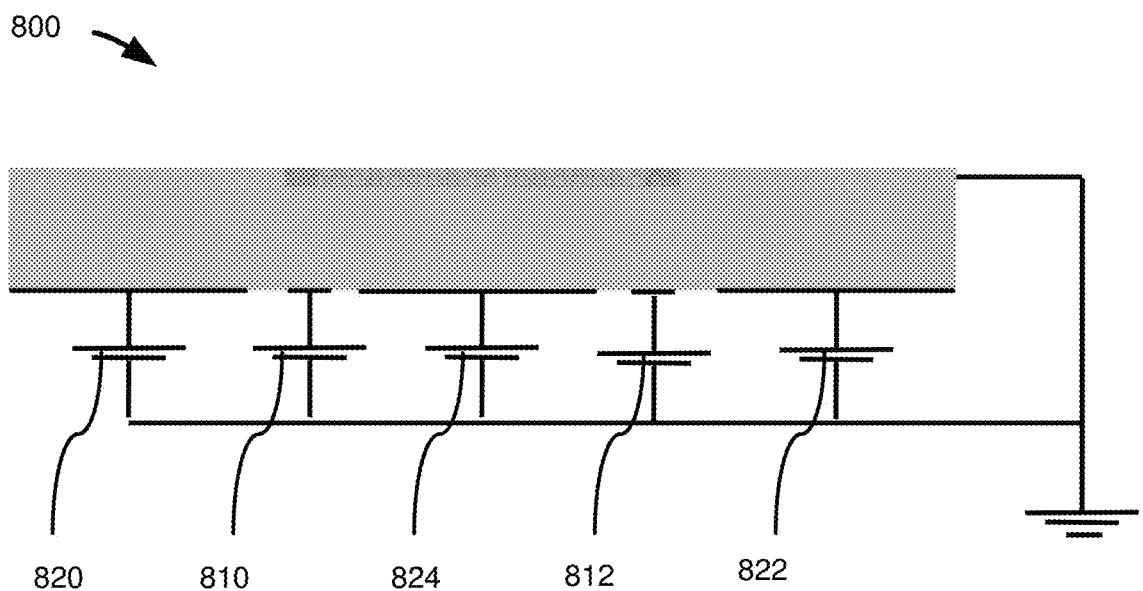
FIG. 8 is a schematic block diagram showing an example circuit diagram of the arrangement shown in FIG. 7.

FIG. 8 is a schematic block diagram 800 showing an example circuit diagram of the arrangement shown in FIG. 7. In particular, FIG. 8 shows gates 810, 812 for controlling the "cutter" (or "wrapper") electrodes described above. FIG. 8 also shows gates 820, 822 for controlling the topological islands 720, 722, as well as a gate 824 for controlling the non-topological island 724.

Figure 9:
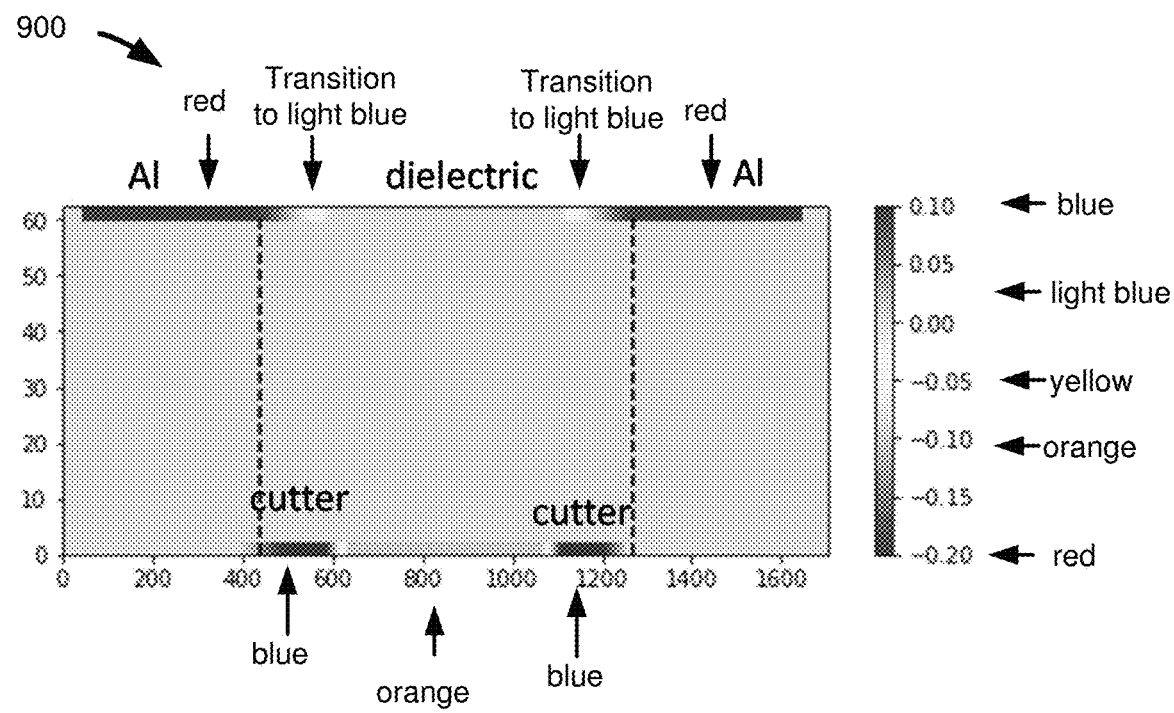
FIGS. 9-12 showing numerical simulation results evaluating aspects of embodiments of the disclosed technology.

FIG. 9 is a graph 900 showing the surface electrostatic environment of the device 800, created by the array of gates 820, 810, 824, 812, 822 and the deposited conductor layer, i.e. 510. This environment acts as a boundary condition for the electrostatic potential in the system. In FIG. 9, the boundary conditions include a band offset for Al/InSb that is −0.2 eV and for SiO/InSb that is 0 eV. FIG. 9 also considers a longitudinal cross section where wrapper gates are modeled as back-gates, the superconducting band offset W=−0.2 eV (shown in red), a positive gate voltage is applied on the cutter, and the left and right plungers are zero. The setup is shown for an example thickness of 60 nm, but the design is not constrained to this value.

Figure 10:
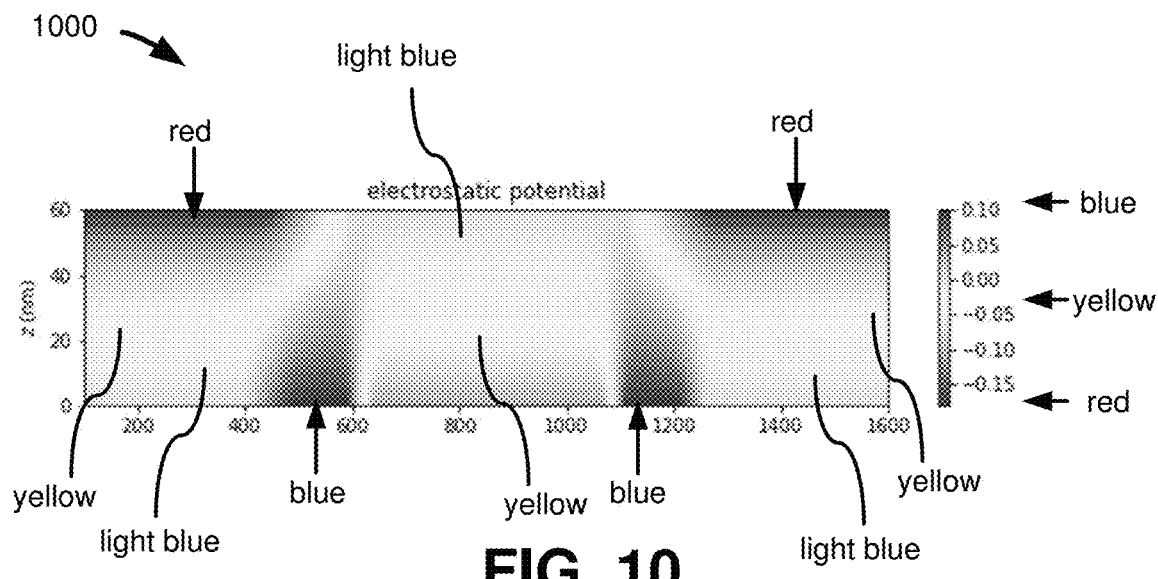

FIG. 10 is a graph 1000 showing results of a calculated electrostatic potential, which boundary conditions are shown in 900, from a Poisson-Schrödinger calculation of an embodiment of the disclosed architecture. In FIG. 10, as an example to test the cutters, a positive voltage was applied on the middle plunger. The electrostatic potential is negative only in the proximity of the deposited conductor and the middle gate, showing the achieved control of electrostatic environment in the system.

Figure 11:
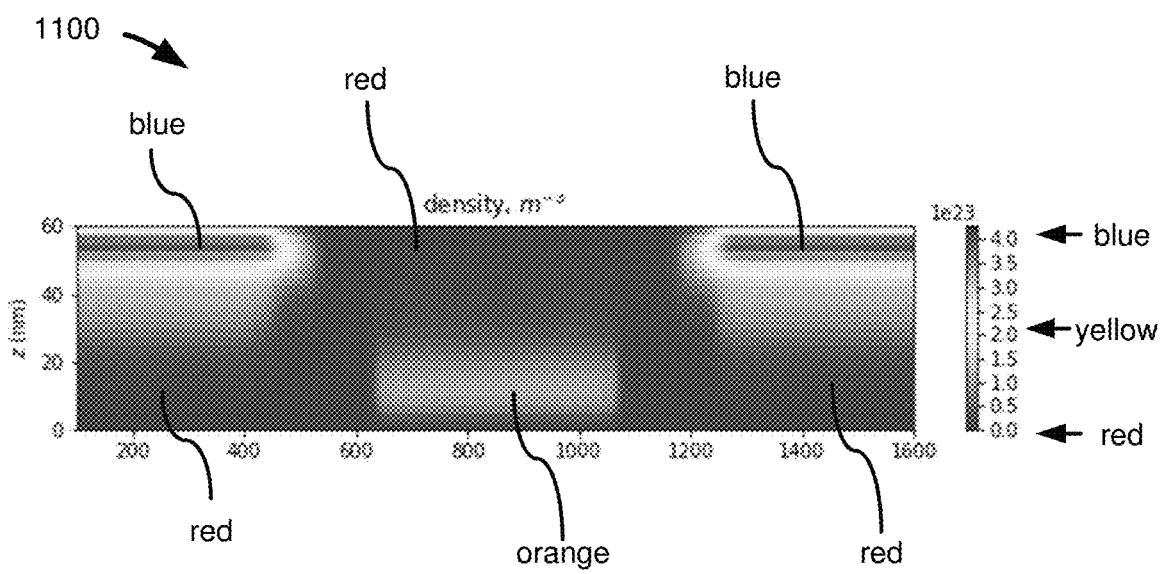

FIG. 11 is a further graph 1100 showing results of a calculated electron density from a Poisson-Schrödinger calculation of an embodiment of the disclosed architecture for the electrostatic potential shown in 1000. As can be seen, there is no density under the cutters indicating a successful depletion of the area covered by the dielectric from the electrons.

Figure 12:
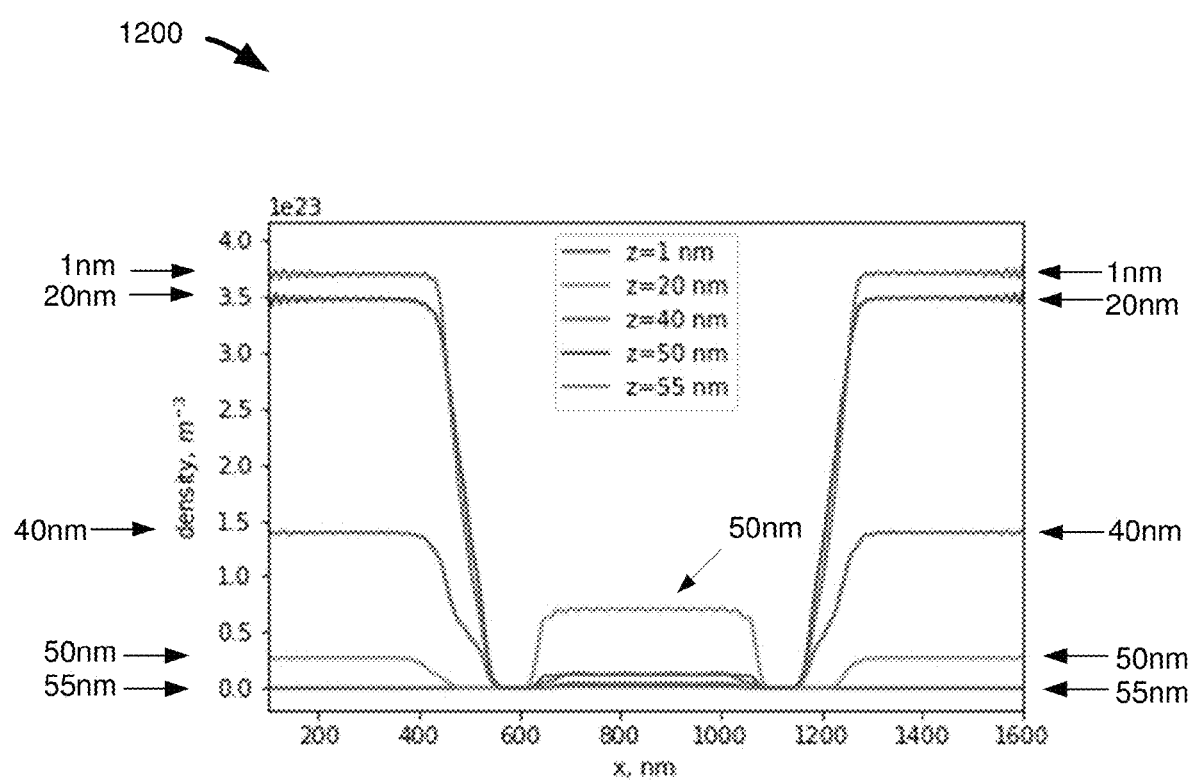

FIG. 12 is a further graph 1200 showing results of a calculated electron density from a Poisson-Schrödinger calculation of an embodiment of the disclosed architecture for the electrostatic potential shown in 1000. In FIG. 12, density profiles are shown in the nanowire for different cuts in z-direction, i.e. horizontal cuts of the data shown in 1100. This figure illustrates a fine control of the electrostatic density in the part covered by the dielectric.

With respect to the Poisson-Schrödinger calculations used to develop the results shown in FIGS. 10-12, the numerical approach is described in more detail in Andrey Antipov et al., "Effects of gate-induced electric fields on semiconductor Majorana nanowires," arXiv:1801.02616 (2018), which is hereby incorporated herein by reference.

The described example method will allow building more complicated structures which are necessary for scalable topological quantum computing. More complicated semiconductor-superconductor devices can be fabricated using two-dimensional electron gas or various nanowire networks. The application of the aforementioned technique to these geometry is straightforward and should enable building the following topological qubits. For instance, in the diagrams below, the regions joining the topological regions (labeled "T") comprise a dielectric insulator (labeled "S") as described earlier.

Figure 13:
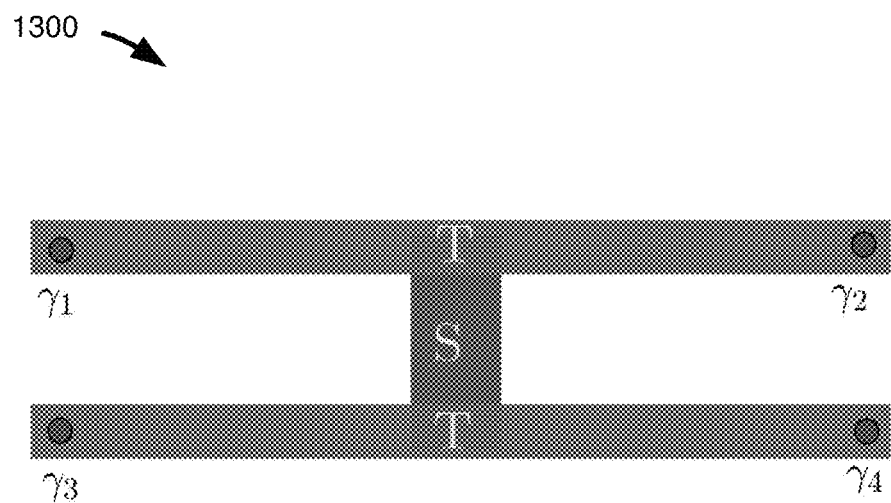
FIG. 13 is a schematic block diagram showing a top view of an example topological quad qubit using embodiments of the disclosed structure.

In particular, FIG. 13 is a schematic block diagram 1300 showing a top view of an example topological quad qubit using embodiments of the disclosed structure. In FIG. 13, four Majorana zero modes are shown and designated as $\gamma_1$, $\gamma_2$, $\gamma_3$, and $\gamma_4$.

Figure 14:
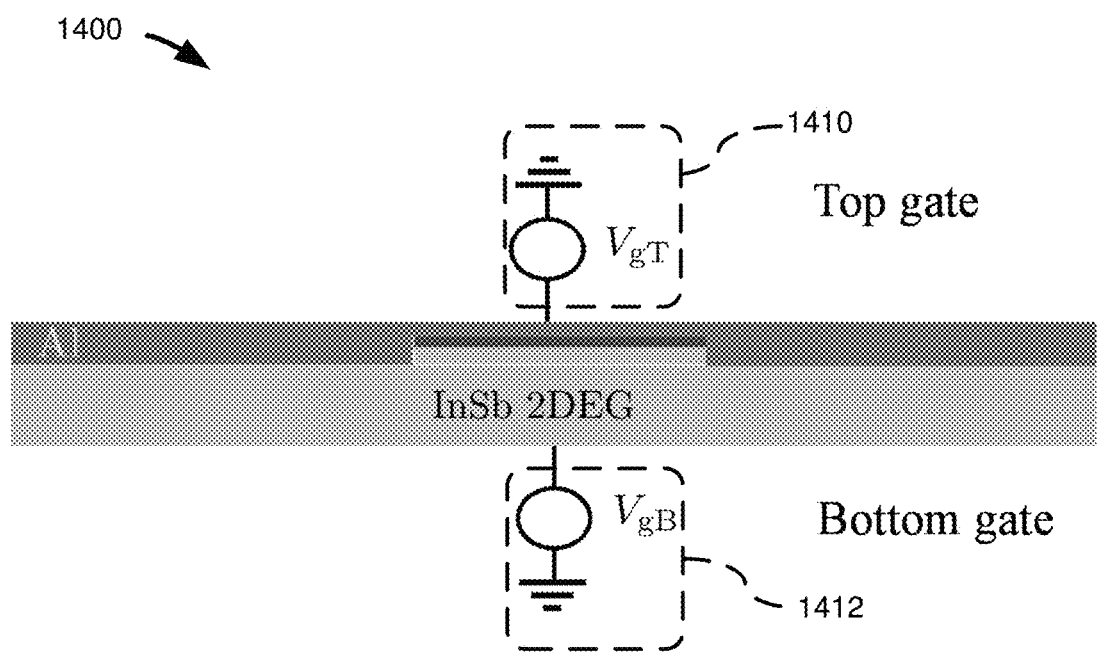
FIG. 14 is a schematic block diagram showing a side view of the example topological quad qubit using embodiments of the disclosed structure.

FIG. 14 is a schematic block diagram 1400 showing a side view of the example topological quad qubit using embodiments of the disclosed structure. In FIG. 14, bottom gate 1412 (which is shown as a single gate but represents one or multiple gates as shown above) depletes the regions not covered by Al and creates network of nanowires. The top gate 1410 (which is shown as a single gate but represents multiple gates as shown above) generates T and S segments. In particular, the S segments appear in the region covered by the insulator.

Figure 15:
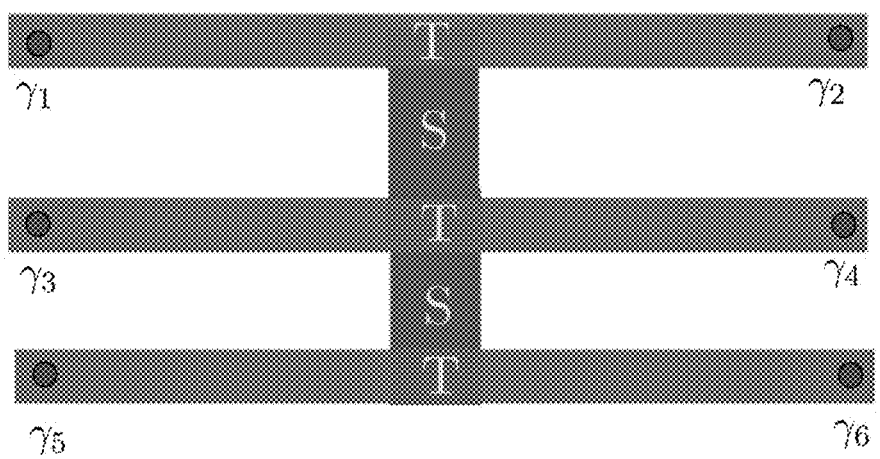
FIG. 15 is a schematic block diagram showing a top view of an example topological hexon qubit using embodiments of the disclosed structure.

FIG. 15 is a schematic block diagram 1500 showing a top view of an example topological hexon qubit using embodiments of the disclosed structure. In FIG. 15, six Majorana zero modes are shown and designated as $\gamma_1$, $\gamma_2$, $\gamma_3$, $\gamma_4$, $\gamma_5$, and $\gamma_6$.

Further examples and details concerning the disclosed technology, as well as the quad, hexon, and other architectures with which the disclosed technology can be used, are described in T. Karzig et al., "Scalable Designs for Quasiparticle-Poisoning-Protected Topological Quantum Computation with Majorana Zero Modes," arXiv:1610.05289 (March 2017) which is hereby incorporated herein by reference.

III. Example General Embodiments

Figure 16:
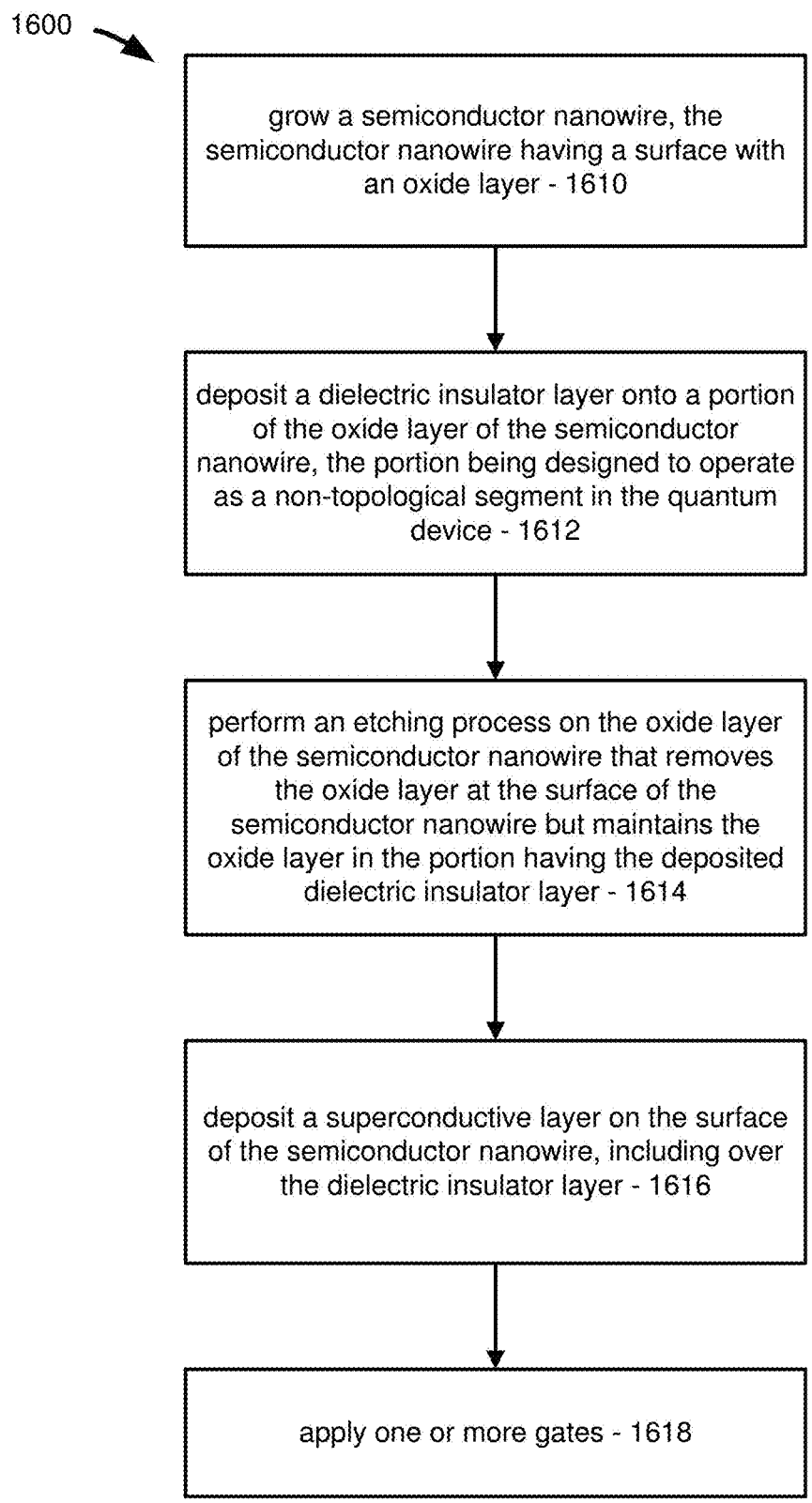
FIG. 16 is a flowchart showing an example procedure for fabricating a quantum device in accordance with embodiments of the disclosed technology.

FIG. 16 is a flowchart showing an example procedure for fabricating a quantum device in accordance with embodiments of the disclosed technology. The particular operations and sequence of operations should not be construed as limiting, as they can be performed alone or in any combination, subcombination, and/or sequence with one another. Additionally, the illustrated operations can be performed together with one or more other operations.

At 1610, a semiconductor nanowire is grown, the semiconductor nanowire having a surface with an oxide layer. In some embodiments, the semiconductor nanowire is an indium antimony (InSb) nanowire or an indium arsenide (InAs) nanowire.

At 1612, a dielectric insulator layer is deposited onto a portion of the oxide layer of the semiconductor nanowire, the portion being designed to operate as a non-topological segment in the quantum device.

At 1614, an etching process is performed on the oxide layer of the semiconductor nanowire that removes the oxide layer at the surface of the semiconductor nanowire but maintains the oxide layer in the portion having the deposited dielectric insulator layer. The etching process can be a hydrogen or other atomic plasma etching process.

At 1616, a superconductive layer is deposited on the surface of the semiconductor nanowire, including over the dielectric insulator layer. The superconductive layer can be an aluminum layer.

At 1618, one or more gates are applied. For instance, the surface can be deemed a first surface, and the method can further comprise applying one or more gates to a second surface of the semiconductor nanowire opposite the first surface.

In certain embodiments, the quantum device is a quad qubit device or a hexon qubit device.

FIG. 17 is a flowchart showing an example procedure for operating a quantum device in accordance with embodiments of the disclosed technology. The particular operations and sequence of operations should not be construed as limiting, as they can be performed alone or in any combination, subcombination, and/or sequence with one another. Additionally, the illustrated operations can be performed together with one or more other operations.

At 1710, a topologically protected qubit having Majorana zero modes is generated by applying an external electric field to segments of the quantum device. In certain embodiments, the applying the external electric field comprises one or more gates coupled to the segments of the quantum device. In some embodiments, through application of the external electric field, the segments of the quantum device comprise: a first topological segment abutting a first end of a non-topological segment; and a second topological segment abutting a second end of the non-topological segment, the second end of the non-topological segment being opposite of the first end of the non-topological segment. In certain embodiments, the external electric field results from applying a gate voltage to one or more bottom gates coupled to the segments of the quantum device. In some embodiments, the applying the electric field creates a non-topological segment of the quantum device in a region of the quantum device having a dielectric layer. Further, in certain embodiments, the quantum device is a quad qubit device or a hexon qubit device.

Further embodiments include a quantum device, comprising: a semiconductive nanowire having a surface that has been etched to remove an oxide layer at a first portion and a second portion of the surface, the semiconductive nanowire further having an oxide layer at a third portion of the surface, the third portion being between the first portion and the second portion of the surface; and a dielectric insulator layer deposited over the third portion but not over the first portion and the second portion. In certain embodiments, the first portion and the second portion are operable to produce topologically protected segments for Majorana zero modes when an in-plane magnetic field is applied. In some embodiments, the third portion is operable to provide a non-topologically protected segment when the in-plane magnetic field is applied. In certain embodiment, the quantum device further comprises a superconductive layer deposited over the first portion, the second portion, and the third portion. In certain implementations, the superconductive layer can be formed from aluminum.

Other embodiments include a quantum device, comprising: a first semiconductive wire having a first wire surface that has been etched to remove a native oxide layer; a second semiconductive wire having a second wire surface that has been etched to remove the native oxide layer; and a semiconductive bridge interposed between the first semiconductive wire and the semiconductive wire, the semiconductive bridge having a native oxide layer that is protected from etching by a dielectric insulator layer deposited over the semiconductive bridge. In some embodiments, the first semiconductive wire is operable to generate a first pair of Majorana zero modes when an in-plane magnetic field is applied, and wherein the second semiconductive wire is operable to generate a second pair of Majorana zero modes when the in-plane magnetic field is applied. In further embodiments, the quantum device comprises a superconductive layer deposited over the first semiconductive wire, the second semiconductive wire, and the semiconductive bridge. In some embodiments, the superconductive layer is formed from Aluminum. In certain embodiments, the quantum device is part of a quad qubit device or part of a hexon qubit device.

IV. Concluding Remarks

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples or with other technologies. For example, any of the disclosed embodiments can also be used with structures created with selective-area-grown techniques. Examples of such structures and techniques are described in U.S. Provisional Patent Application No. 62/572,560 entitled "SIDE-GATING IN SELECTIVE-AREA-GROWTH TOPOLOGICAL QUBITS" and filed on Oct. 15, 2017, and also described in PCT International Application No. PCT/US18/39833 entitled "SIDE-GATING IN SELECTIVE-AREA-GROWN TOPOLOGICAL QUBITS" and filed on Jun. 27, 2018, both of which are incorporated herein by reference in their entirety.

In view of the many possible embodiments to which the principles of the disclosed technology may be applied, it should be recognized that the illustrated embodiments are examples of the disclosed technology and should not be taken as a limitation on the scope of the disclosed technology.

What is claimed is:

1. A method for fabricating a quantum device, comprising:
    growing a semiconductor nanowire, the semiconductor nanowire having a first surface and a second surface, the first surface having an oxide layer;
    depositing a dielectric insulator layer onto the oxide layer at a portion of the semiconductor nanowire, the portion being designed to operate as a non-topological segment in the quantum device; and
    applying one or more gates to the second surface of the semiconductor nanowire.

2. The method of claim 1, further comprising:
    performing an etching process on the oxide layer of the semiconductor nanowire that removes the oxide layer at the first surface of the semiconductor nanowire but maintains the oxide layer in the portion of the first surface having the deposited dielectric insulator layer.

3. The method of claim 2, wherein the portion of the first surface of the semiconductor nanowire having the deposited dielectric insulator layer is situated between first and second portions of the first surface of the semiconductor nanowire from which the oxide layer is remove by the etching process.

4. The method of claim 3, wherein the etching process is an atomic plasma etching process.

5. The method of claim 2, wherein the etching process is a hydrogen plasma etching process.

6. The method of claim 2, further comprising:
    depositing a superconductive layer at the first surface of the semiconductor nanowire, including over the dielectric insulator layer.

7. The method of claim 6, wherein the superconductive layer is aluminum.

8. The method of claim 2, further comprising forming wrapper gates proximate ends of the portion of the semiconductor nanowire having the deposited dielectric insulator layer.

9. The method of claim 8, wherein the wrapper gates are situated between 50 nm and 100 nm away from ends of the portion of the semiconductor nanowire having the deposited dielectric insulator layer.

10. The method of claim 9, wherein a width of the wrapper gates is at least 100 nm and a width of the dielectric insulator layer is 0.5-1 µm.

11. The method of claim 1, wherein the oxide layer is formed of $SiO_2$, $HfO_2$, or a combination thereof.

12. The method of claim 1, wherein the oxide layer is a native oxide.

13. The method of claim 1, wherein the semiconductor nanowire is an InAs or InSb nanowire.

14. The method of claim 1, wherein a width the portion of the semiconductor nanowire having the deposited dielectric insulator layer is less than 100 nm.

* * * * *